United States Patent [19]

Berger et al.

[11] Patent Number: 5,208,821
[45] Date of Patent: May 4, 1993

[54] BURIED HETEROSTRUCTURE LASERS USING MOCVD GROWTH OVER PATTERNED SUBSTRATES

[75] Inventors: Paul R. Berger, Summit; Niloy K. Dutta, Colonial; William S. Hobson, Summit; John Lopata, North Plainfield, N.J.

[73] Assignee: AT&T Bell Laboratories, Murray Hill, N.J.

[21] Appl. No.: 825,208

[22] Filed: Jan. 24, 1992

[51] Int. Cl.$^5$ .................................................. H01S 3/19
[52] U.S. Cl. ........................................ 372/48; 372/46; 372/45; 437/129
[58] Field of Search ...................... 372/45, 46, 48; 437/129, 201, 230, 946

[56] References Cited

U.S. PATENT DOCUMENTS

| | | | |
|---|---|---|---|
| 4,426,701 | 1/1984 | Botez | 372/48 |
| 4,749,255 | 6/1988 | Chakrabarti et al. | 350/164 |
| 4,902,644 | 2/1990 | Wilt | 372/48 |
| 4,908,831 | 3/1990 | Yoshida et al. | 372/46 |

OTHER PUBLICATIONS

D. E. Ackley and G. Hom, "Twin-Channel Substrate-Mesa-Guide Injection Lasers Fabricated By Organometallic Vapor Phase Epitaxy" *Appl. Phys. Lett.* 42(8), Apr. 15, 1988, pp. 653-655.

N. K. Dutta et al. "Temperature Dependence of Threshold of Strained Quantum Well Lasers", *Appl. Phys. Lett.* 58 (11), Mar. 18, 1991, pp. 1125-1127.

Primary Examiner—Georgia Y. Epps
Attorney, Agent, or Firm—Oleg E. Alber

[57] ABSTRACT

This invention pertains to buried heterostructure lasers which have been fabricated using a single step MOCVD growth of an MQW laser structure over a pattern etched GaAs substrate. The wet chemical etching of grooves having a dovetailed cross-section and being parallel to the [0$\overline{1}$1] direction in GaAs substrates produced reentrant mesas which resulted in isolated laser active regions buried by the AlGaAs cladding layer. The 250 μm long uncoated lasers emit at about 1 μm. Lasers with coated facets have threshold currents of 20 mA and emit >100 mW per facet under room temperature operation. The external differential quantum efficiency for currents of from 30 mA to about 50 mA is found to be nearly independent of temperature in the range of 10° C. to 90° C. suggesting a low temperature dependence of leakage current.

33 Claims, 4 Drawing Sheets

BURIED HETEROSTRUCTURE LASERS USING MOCVD GROWTH OVER PATTERNED SUBSTRATES

TECHNICAL FIELD

This invention pertains to buried heterostructure lasers with MOCVD growth over patterned substrates.

BACKGROUND OF THE INVENTION

Semiconductor lasers fabricated from strained layer quantum well material have attracted considerable interest as pump lasers for erbium doped glass fiber amplifiers. However, ridge waveguide lasers with planar multi-quantum well (MQW) $In_{0.2}Ga_{0.8}As/GaAs$ heterostructures grown by molecular beam epitaxy (MBE) and metal organic chemical vapor deposition (MOCVD) growth techniques are weakly index-guided, and their mode stability is not expected to be as good as that for a strongly index-guided buried heterostructure lasers. For example, see N. K. Dutta et al. "Temperature Dependence of Threshold of Strained Quantum Well Laser", *Appl. Phys. Lett.* 58 (11), Mar. 18, 1991, pages 1125-1127. The latter include several types of InGaAs/GaAs buried heterostructure lasers fabricated using multistep growths. An improvement in the lateral optical confinement in quantum well stripes resulted in lasers with GaAs/AlGaAs heterostructures fabricated using a single step growth on nonplanar GaAs substrates. One example of such a single growth structure is disclosed in an article by D. E. Ackley and G. Hom entitled "Twin-Channel Substrate-Mesa Guide Injection Lasers Fabricated by Organometallic Vapor Phase Expitaxy", *Applied Physics Letters*, Vol. 42, No. 8, April 1983, pages 653-655. Ackley and Hom disclose a high-power index-guided laser fabricated by a one-step organometallic vapor phase epitaxy on photolithographically patterned and etched substrates. A narrow mesa is defined by a twin-channel v-groove structure. The twin channel structure provides for an improved control over the width of the lateral waveguide relative to a single groove configuration, which allows well-controlled zero order mode operation. However, the growth of the active layer is continuous over the side walls of the v-grooves of the twin-channel defined mesa structure. This would lead to the spreading of carriers across the whole of the width of the active layer, not just across its portion on the mesa. Lateral electrical confinement was achieved by ion implantation after the growth of the semiconductor structure. Since ion-implantation requires subsequen heating of the device, this adds to the complexity of the process, negating the advantages of the single-step growth processing. Therefore, it is desirable to produce a buried heterostructure laser in a more simplified manner.

SUMMARY OF THE INVENTION

This invention is a simplified process of producing buried heterostructure lasers and lasers produced by the method. In this process a single-step metal organic chemical vapor deposition (MOCVD) growth has been used to fabricated a buried heterostructure InGaAs/GaAs multi-quantum well laser over a patterned GaAs substrate. The pattern is a reentrant mesa defined by two dovetailed grooves formed by wet chemical etching oriented along [0$\bar{1}$1] direction. Growth over the mesa results in isolated buried heterostructures. The 250 $\mu$m long lasers emitted near 1 $\mu$m. The external differential quantum efficiency in the current range of from 30 mA to about 50 MA is almost independent of temperature in the temperature range of 10° C. to 90° C. which suggests a minimal temperature dependent leakage current. Lasers with coated facets have threshold currents of 20 mA and emit >100 mW/facet at room temperature.

DETAILED DESCRIPTION

This invention embodies the fabrication of a buried heterostructure laser using a single-step growth by MOCVD over a reentrant mesa patterned semiconductor substrate. The growth over the reentrant mesa produces a discontinuity in the growth of a bottom confining layer and of an active layer, while the overgrowth of the top confining layer results in a buried heterostructure laser structure. The laser is a structure comprising group III-V or II-VI compound semiconductors, such as GaAs, AlAs, AlGaAs, InP, GaInP, AlInP, GaInAs, GaInPAs, AlGaInAs, and other lattice compatible compound semiconductors based on group III-V or II-VI semiconductors.

Figure 1:
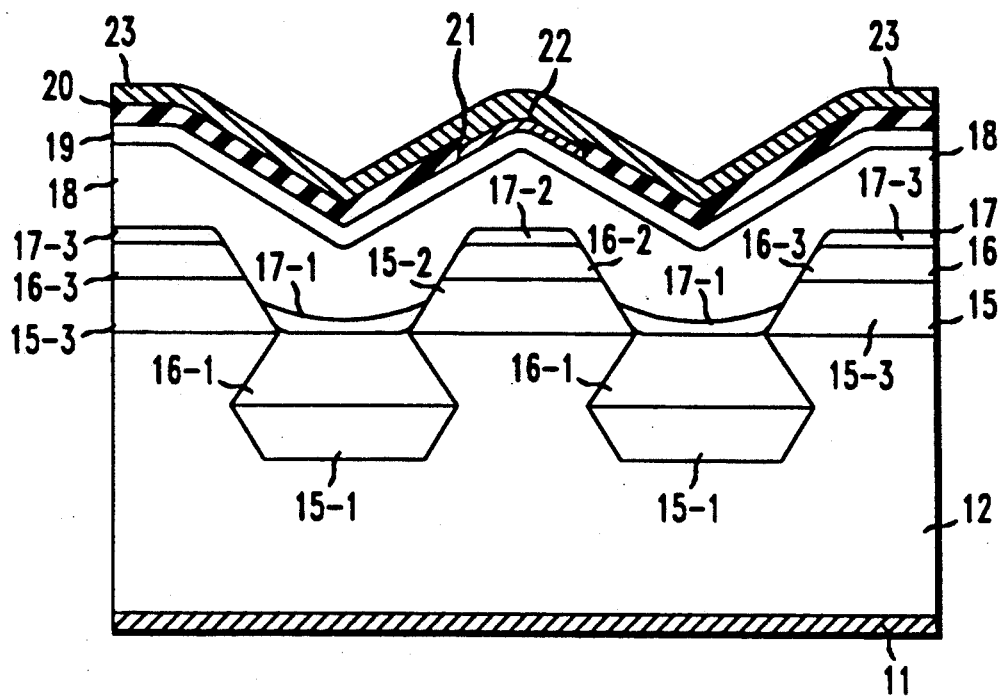
FIG. 1 is a schematic representation of a buried heterostructure InGaAs/GaAs MQW laser.

FIG. 1 is a schematic cross-sectional representation of a laser, 10, according to the invention. Laser 10 includes in an ascending order, a bottom electrode, 11, a patterned substrate, 12, of one conductivity type provided with dovetailed grooves, 13, forming a reentrant mesa, 14, a discontinuous buffer layer, 15, having sections 15-1, 15-2 and 15-3 of said one conductivity type, a discontinuous bottom confining layer, 16, having sections 16-1, 16-2 and 16-3 of said one conductivity type, a discontinuous active layer, 17, having sections 17-1, 17-2 and 17-3, a top confining layer, 18, of another conductivity type opposite to said one conductivity type, a contact layer, 19, of said another conductivity type, a dielectric layer, 20, having a window, 21, a top stripe electrode, 22, within the window, and an overlay electrode, 23.

Construction of laser 10 is described below. For clarity reasons, various elements of the laser are not drawn to scale. The invention is described with reference to an $Al_xGA_{1-x}As/GaAs/In_yGa_{1-y}As$ system in which x is from 0 to 0.4 and y is from 0 to 0.25.

Figure 2:
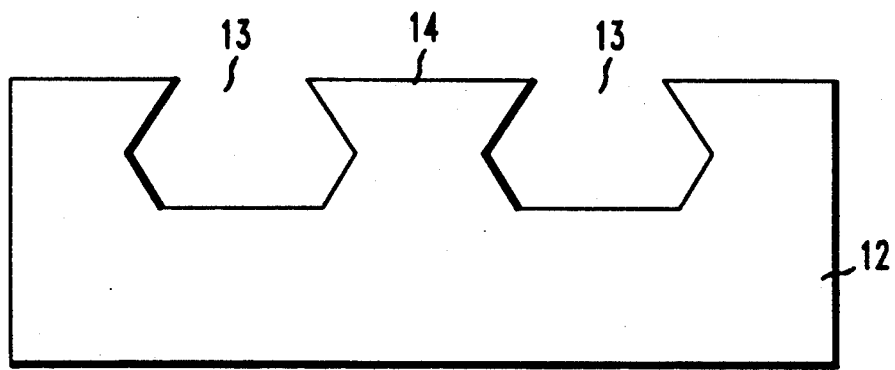
FIG. 2 is a schematic representation of the compound semiconductor substrate with a reentrant mesa bordered by two dovetailed grooves used in the fabrication of the laser of FIG. 1.

Substrate 12 is a heavily doped n+ type GaAs having two dovetailed grooves 13 which form reentrant mesa 14. (FIG. 2). Typically the thickness of the substrate ranges from 100 to 500 $\mu$m and the doping concentration of the substrate ranges from $1\times10^{17}$ to $1\times10^{19}$ cm$^{-3}$. In some applications the substrate may be first grown on a master substrate of silicon which is common to a number of devices on the master substrate. Buffer layer 15 is also n-type GaAs deposited in a thickness typically ranging from 0.1 μm to 5 μm, and with a doping concentration of from $1 \times 10^{17}$ to $1 \times 10^{19}$ cm$^{-3}$. The buffer layer serves the purpose of stopping possible propagation of defects from the substrate. The buffer layer is in the form of independent sections 15-1, 15-2 and 15-3. Sections 15-1 overlay the bottom of each dovetailed groove 13; section 15-2 overlays the top surface of mesa 14; and sections 15-3 overlay each of the remaining portions of the top surface of the substrate.

The bottom and the top confining layers 16 and 18 are provided to confine carriers and, thus, the radiation of active layer 17 within the narrow thickness of the active layer. The confining layers are typically deposited in a thickness of up to 3 μm, and with a doping concentration of from $1 \times 10^{17}$ to $1 \times 10^{19}$ cm$^{-3}$. In this embodiment, the confining layers are of $Al_xGa_{1-x}As$ with x ranging from 0.1 to 0.4. The bottom confining layer is an n-type $Al_xGa_{1-x}As$ and is in the form of independent sections 16-1, 16-2 and 16-3 which overlay sections 15-1, 15-2 and 15-3, respectively, of the buffer the layer.

Active layer 17 is in the form of independent sections 17-1, 17-2 and 17-3 which overlay sections 16-1, 16-2 and 16-3, respectively, of the bottom confining layer. The active layer includes at least one quantum well (QW) comprising $In_yGa_{1-y}As$ well and GaAs barriers, with y being from 0.05 to 0.25.

Top confining layer 18 is of a p-type $Al_xGa_{1-x}As$ with x ranging from 0.1 to 0.4. Layer 18 overlays sections 17-1, 17-2 and 17-3 of the active layer and those portions of sections 15-2 and 15-3 and of sections 16-2 and 16-3 which are laterally exposed, such that section 17-2 of the active layer on the mesa is buried and is separated from sections 17-1 and 17-3 by the top confining layer.

Thin contact layer 19 of highly doped p+ type GaAs completes the compound semiconductor structure. Typically, the doping concentration of the contact layer ranges from $1 \times 10^{19}$ to $1 \times 10^{20}$ cm$^{-3}$. Contact layer 19 is provided in a thickness ranging from 0.01 to 0.1 μm to facilitate establishing an ohmic contact between top confining layer 18 and top electrode 22.

Dielectric insulating layer 20, having window 21 which is centered over mesa 14, overlays the upper surface of contact layer 19 except for the portion o the surface of contact layer 19 which is exposed in the window, that is for an area immediately overlaying the area of mesa 14 and, thus, of section 17-2 of the discontinuous active layer 17. The dielectric layer insulates the top surface of contact layer 19 and protects it from environmental influences. The dielectric layer may be of a material selected from such insulating materials as $SiO_2$, $SiN_x$ and borosilicate glass (Vycor®).The first two are deposited by plasma CVD, while the latter is deposited by e-beam deposition. Top electrode 22 overlays that portion of the surface of contact layer 19 which is exposed in window 21. Since window 21 is of approximately the same length and width as the mesa, top electrode 22 is also centered over the mesa and over section 17-2 of the active layer which is upon the mesa. Top electrode 22 is of a metal or metal alloy selected from metals or alloys which are inert to or complement the conductivity type of the top confining and contact layers.

Overlay electrode 23 is deposited over the insulating layer 19 and in electrical contact with top electrode 22. Overlay electrode 23 covers the whole of the upper surface of dielectric layer 18 and of top electrode 22. Overlay electrode 23, deposited in a thickness of from 0.05 to 1.0 μm, acts as a protective cover, as a surface for establishing an electrical contact to top electrode 21, and as a broad electrical connection area.

Bottom electrode 11 is formed on the bottom surface of substrate 12 by depositing a suitable metal or alloy compatible with the conductivity type of th substrate, and alloying the electrode to the substrate. Optionally a layer of gold may be deposited on top of either one or both of overlay electrode 23 and bottom electrode 11. Finally, the bottom side of the laser may be mounted on a copper slab which serves as a heat sink.

The preparation of the device begins with forming in the substrate a pattern shown in FIG. 2.Wafer substrates were etched for form "dovetail" grooves on either side of a reentrant mesa. Layers 15–19 forming the laser structure are then grown upon the patterned substrate in succession preferably by such known methods as metal organic vapor phase epitaxy (MOVPE), also known as metal organic chemical vapor deposition (MOCVD). These layers may also be deposited by such other known method as molecular beam epitaxy (MBE) or hydride vapor phase epitaxy (VPE). An important requirement is the deposition of layers 15–17 suc that section 17-2 on the mesa grown apart form other sections, e.g., 17-1 and 17-3 of layer 17.Due to the dovetailed shape of the grooves and of the reentrant shape of the mesas, the MOCVD growth of layers 15, 16 and 17 over the mesa is not continuous with the growth in the grooves and in the field. This results in an isolated layered structure including the MQW active layer 17-2 above the mesas. The top confining layer 18 fills in regions in the grooves, along the side and above the mesas. It is important that the substrate should be so oriented and the etching is so conducted that when the buffer, bottom confining and active layers are deposited, they form discontinuous layers and especially that at least section 17-2 of active layer 17 on the mesa does not have any continuity with sections 17-1 in the grooves. Hence this growth process results in MQW active regions (17-2) on top of the mesa which are buried in higher band gap and lower index layer 18. This assures that the current applied between top electrode 22 and bottom electrode 11 will pass through active layer section 17-2 but carriers will not spread along the whole of the active layer, including sections 17-1.

In the preferred embodiment, the laser is an $Al_xGa_{1-x}As/GaAs/In_yGa_{1-y}As$ structure comprising, in an ascending sequence, a 0.1 to 0.5 μm thick AuGe electrode 11, about 100 μm thick (100) oriented heavily doped ($2 \times 10^{18}$ cm$^{-3}$) n+-GaAs substrate 12, a 0.2 to 0.3 μm thick n-type GaAs buffer layer 15 ($3 \times 10^{18}$ cm$^{-3}$), having sections 15-1, 15-2 and 15-3, a 1.5 μm thick n-$Al_{0.4}Ga_{0.6}As$ bottom confining layer 16 ($2 \times 10^{18}$ cm$^{-3}$), having sections 16-1, 16-2 and 16-3, an MQW active layer 17 having section 17-1, 17-2 and 17-3 consisting of three $In_{0.2}Ga_{0.8}As$ well 80 Å thick each and four GaAs barrier layers 200 Å thick each, 1.5 μm thick, p-$Al_{0.4}Ga_{0.6}As$ top confining layer 18 ($2 \times 10^{18}$ cm$^{-3}$), and a 200 Å thick heavily doped ($1 \times 10^{19}$ cm$^{-3}$)p+-GaAs contact layer 19. Alternatively, each of the confining layers may be deposited as a composite of 1.5 μm thick $Al_{0.4}Ga_{0.6}As$ and a 400 Å thick $Al_{0.15}Ga_{0.85}As$ layers, with the latter being in contact with the active layer. The $Al_{0.15}Ga_{0.85}As$ layers are deposited optionally to narrow the far field of the device. The structure further includes an about 3000 Angstrom thick SiO$_2$ layer 20 having 2 to 4 μm wide window 21, a 0.08 μm thick AuBe top electrode 22 coextensive of window 21 and an 0.1 μm thick TiAu overlay electrode 23.

The laser semiconductor structure shown in FIG. 1 was grown on one lateral surface of an +-GaAs (100) substrate wafer which was patterned with grooves to leave mesas parallel to the [0$\bar{1}$1] direction. Standard photolithographic and wet chemical techniques were used to obtain mesas of ~4 μm wide. Wet chemical etching of n+-GaAs wafers with a mixture of H$_2$SO$_4$:-H$_2$O$_2$:H$_2$O in a ratio of 1:1:1 is used to produce in the substrate wafer two dovetailed grooves 13 and the reentrant mesa 14 per device. The etching is conducted at room temperature for a period of from 5 to 15, preferably 10 seconds. The dovetail grooves are from 5 to 3, preferably 4 μm wide and from 3 to 1, preferably 2 μm deep and are spaced each from another a distance of from 4.5 to 3.5 μm defining the reentrant mesa. The following layers were then grown over the etched wafer using the MOCVD growth technique: 0.5 μm thick n+-GaAs buffer layer, followed by a 1.5 μm thick n-Al$_{0.4}$Ga$_{0.6}$As confining layer, the MQW active region consisting of 3 wells of 80 Å thick In$_{0.2}$Ga$_{0.8}$As and four 200 Å thick GaAs barrier layers, 1.5 μm thick p-Al$_{0.4}$Ga$_{0.6}$As confining layer and a 200 Å thick p+-GaAs contacting layer. The dopants used were Zn and Si for the p-type and n-type layers, respectively.

After semiconductor layers 15–19 are deposited on the patterned substrate wafer, the fabrication process of the lasers (FIG. 1) is continued by formation of a SiO$_2$ layer and of AuBe (p-contact) top electrode, wafer thinning, formation of an AuGe (n-contact) bottom electrode, and formation of TiAu metal overlayer on the top of the SiO$_2$ and AuBe layers. The p-side of the wafer (surface of contact layer 19) is processed by depositing 3000 Å SiO$_2$ and opening 2.5–4.5 μm wide windows over the mesas and active regions on the mesas, using photolithography and buffered oxide etchant to pattern the SiO$_2$. AuBe alloy (p-contact metal) was deposited in a thickness of 0.08 μm using standard photolithographic and lift-off methods resulting in AuBe contacts to contact layer 19 exposed in window 21 in the SiO$_2$ layer. The AuBe p-contact was then alloyed in a forming gas environment at 420° C. for 30 sec. After this the bottom side of the wafer was thinned to 100 μm by chemo-mechanically polishing the substrate side using a 3 percent Bromine-Methanol solution. The bottom electrode 11 (n-contact) was prepared by depositing an AuGe alloy over the bottom surface of the substrate, and rapid thermally alloying at 350° C. for 30 sec in forming gas. Deposition of thin layers of Ti and Au in a total thickness of from 0.05 to 1.0 μm by an e-beam evaporation process on top of the SiO$_2$ layer and of top electrode 22 completed the p-side processing. The wafer was then cleaved to produce chips of 250 μm cavity length.

Figure 3:
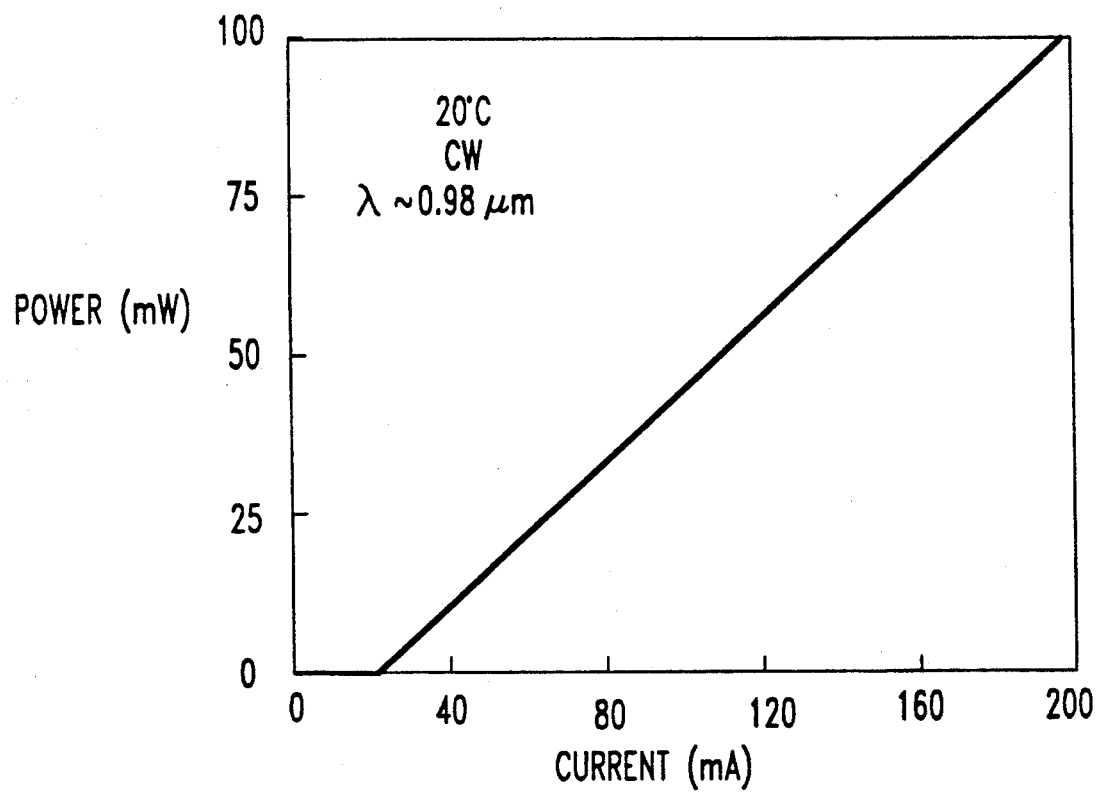
FIG. 3 is a plot of power in mW versus current in mA for continuous wave operation of the laser of FIG. 1 at room temperature and wavelength of approximately 0.98 $\mu$m.
Figure 4:
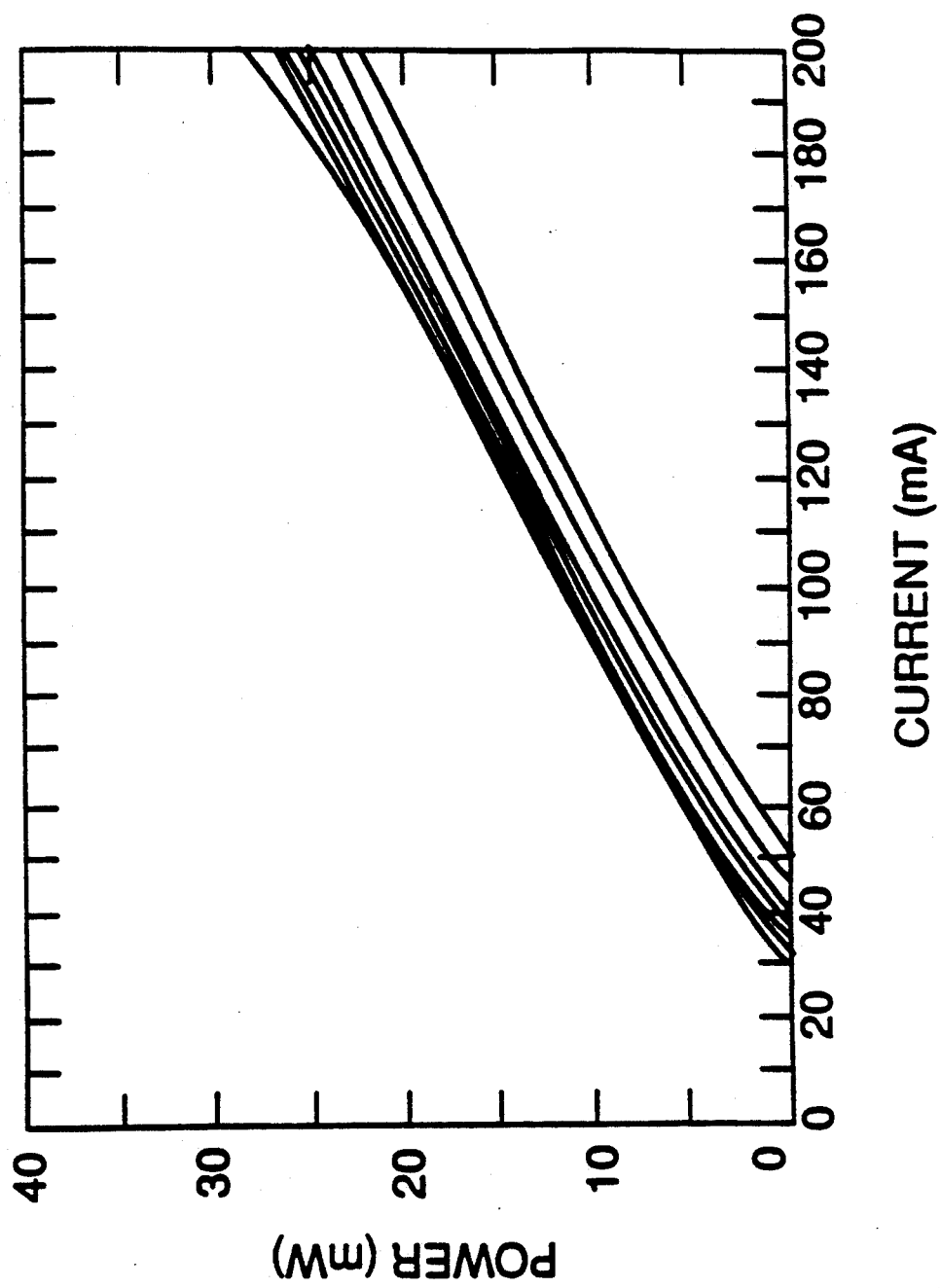
FIG. 4 is a plot of light versus current curves for a buried heterostructure laser operated at temperatures ranging from 10° C. to 90° C.
Figure 5:
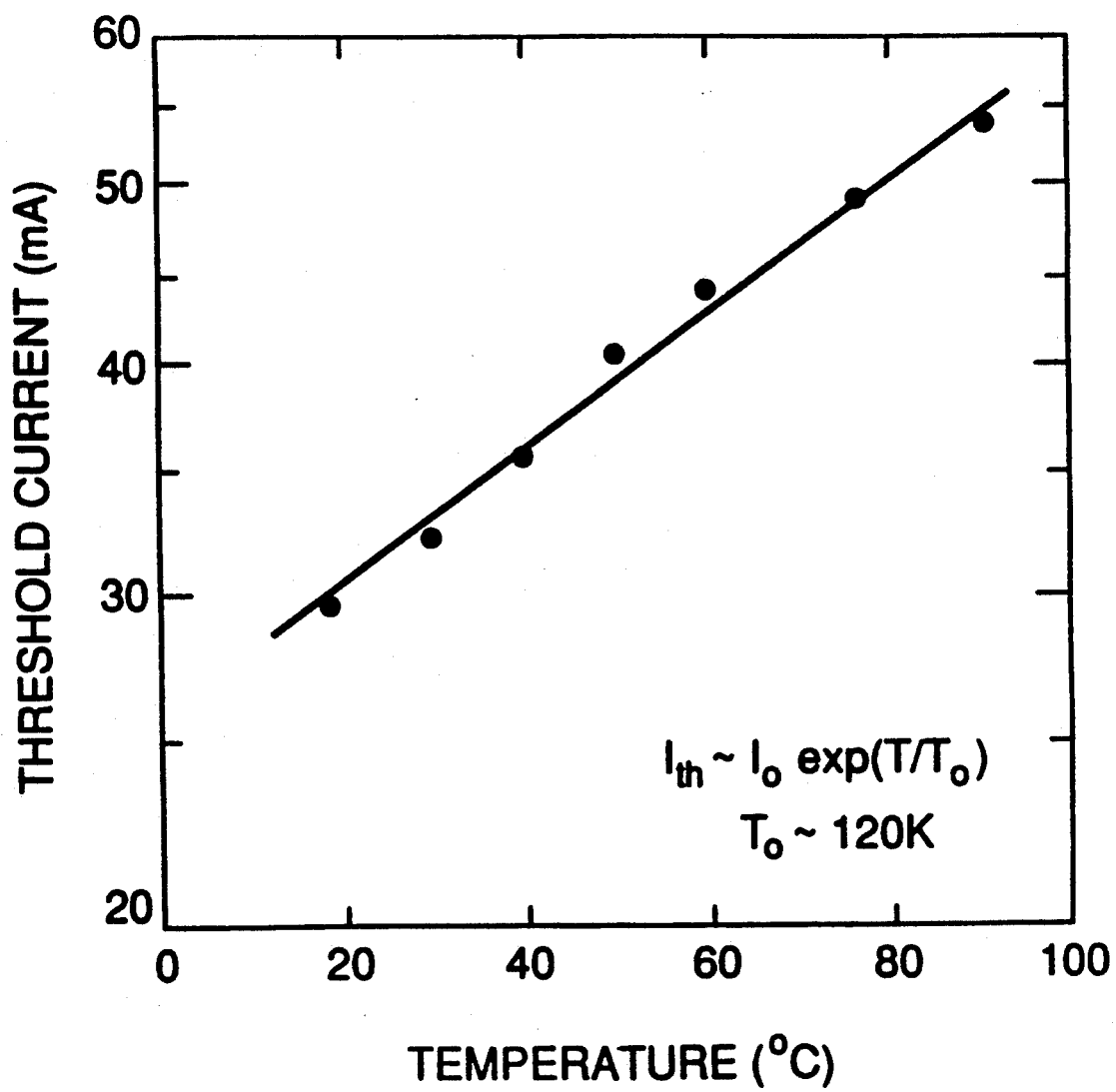
FIG. 5 is a plot of threshold current versus temperature for a buried heterostructure laser.

The 250 μm long lasers emitted near 1 μm. Lasers with coated facets were found to have threshold currents of ~20 mA and were capable of emitting >100 mW per facet at room temperature continuous wave (CW) operation. See FIG. 3. For an example of coating mirror facets on a laser device see U.S. Pat. No. 4,749,255 issued Jun. 7, 1988, to Utpal K. Chakrabarti et al. Light intensities for lasers with uncoated facets in mW versus current characteristics of the laser in mA at different temperatures are shown in FIG. 4. The external differential quantum efficiency is found to be nearly independent of temperature in the range of 10° C. to 90° C. suggesting a low temperature dependence of leakage current. The lasing threshold was found to increase from 30 mA at room temperature to ~50 mA at 90° C. operation. The nearly parallel slopes of the L-I curves show a small variation of the external quantum efficiency with temperature which suggests a low temperature dependent leakage current. The threshold current plotted as a function of temperature is shown in FIG. 5. The dependence of the threshold current on temperature is represented by the expression:

$$I_{th} = I_0 \exp(T/T_0) \tag{1}$$

where $I_{th}$ is the threshold current and T is the temperature while $I_0$ and $T_0$ are constants. For the temperature range of 10° C. to 90° C., the value of the characteristic temperature, $T_0$, is determined to be 120K.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

We claim:

1. A buried heterostructure laser, which comprises:
   a compound semiconductor structure and a top and a bottom electrode to the said structure, said structure comprising in an ascending order
   a substrate of one conductivity type, a buffer layer of said one conductivity type, a bottom confining layer of said one conductivity type, an active layer, a top confining layer of another conductivity type, and a contact layer of said another conductivity type, in which
   said substrate has two parallel grooves forming a reentrant mesa and shoulder sections, each of said grooves having a dovetailed cross-section, said buffer layer, said bottom confining layer and said active layer each having sections arranged in columns on the mesa, in the grooves and on the shoulders, each of said sections in one column being laterally discontinuous with respect to the related sections in adjacent columns, said top confining layer overlaying sections of the active layer on top of each column and sloped walls of sections of the buffer layer, bottom confining layer and active layer so as to bury the section of the active layer of the column above the mesa and separate this section from other columns,
   a dielectric layer on the contact layer, said dielectric layer having a window coextensive with the mesa,
   a top electrode in contact with the contact layer exposed in said window, said top electrode being also coextensive of the mesa, and
   an overlay electrode on the whole of the upper surface of the said top electrode and of said dielectric layer and forming contact to the top electrode.

2. The laser of claim 1, in which respective sections of any one of the layers in the groove are totally structurally disconnected from secions of the same layers in adjacent columns.

3. The laser of claim 1 in which each of said layers of the semiconductor structure is deposited by MOCVD.

4. The laser of claim 1, in which said structure is AlGaAs/GaAs/InGaAs system.

5. The laser of claim 4, in which each of said bottom and top confining layers is of $Al_xGa_{1-x}As_1$, with x being from 0.1 to 0.4, and said active layer is GaAs.

6. The laser of claim 1, a section of the active layer above the mesa is buried by the top confining layer.

7. The laser of claim 1 in which said active layer is a multilayer quantum layer comprising at least one $In_yGa_{1-y}As$ well and GaAs barriers with y being within a range of from 0.05 to 0.25.

8. The laser of claim 7, in which the active layer includes three $In_{0.2}Ga_{0.8}As$ wells and four GaAs barriers.

9. The laser of claim 1 which the top electrode is in the form of a narrow metal strip on top of the contact layer, said top electrode being coextensive with and in superimposed relation with the mesa and the section of the active layer above the mesa.

10. The laser of claim 9 in which said top electrode comprises AuBe.

11. The laser of claim 1, in which said overlay electrode comprises TiAu.

12. The laser of claim 1, in which said substrate is of (100) orientation, and said grooves are etched with [0$\overline{1}$1] orientation.

13. The laser of claim 12, in which said grooves were etched with a mixture of $H_2SO_4:H_2O_2:H_2O$ in ratio of 1:1:1.

14. The laser of claim 1, in which each of said confining layers comproses $Al_{0.4}Ga_{0.6}As$.

15. The laser of claim 1, in which each of said confining layers further comprises a thin $Al_{0.15}Ga_{0.85}As$ layer positioned between the active layer and the $Al_{0.4}Ga_{0.6}As$ layer.

16. The laser of claim 1, in which said dielectric layer comprises $SiO_2$.

17. A method of fabricating a buried heterostructure laser, which comprises:
    forming a compound semiconductor structure comprising in succession from a substrate a buffer layer, a bottom confining layer, an active layer, a top confining layer, and a contact layer, and
    providing said structure with a top and a bottom electrode,
    in which said semiconductor structure is formed by the steps comprising:
    forming in a surface of a compound semiconductor substrate two parallel divetail-shaped grooves defining a reentrant mesa and shoulder portions,
    depositing in succession onto the surface of the mesa, of the shoulder portions and into the grooves a buffer material, a bottom confining material and an active material forming columns of layer sections of said successive materials, each column including the buffer material, the confining material and the active material layer sections, said material layer sections in each column being separated from layer sections of the same material in adjaecent columns, and
    depositing a top confining material as a continuous layer over the active material in the mesa column, shoulder columns and groove columns and over side walls of the mesa and shoulder columns so as to bury the active material on the mesa.

18. The method claim 17, in which a highly doped contact layer is deposited on top confining layer.

19. The method of claim 18, in which as insulating layer is deposited on the contact layer, and a window is formed in the insulating layer, said window being coextensive of the mesa.

20. The method of claim 19, in which a contact electrode is deposited onto contact layer area exposed in the window.

21. The method of claim 20, in which an overlay electrode is deposited over the top contact electrode and the insulating layer.

22. The method of claim 17, in which each of said layers of the semiconductor structure is deposited by MOCVD.

23. The method of claim 17, in which said laser semiconductor structure is AlGaAs/GaAs/InGaAs system.

24. The method of claim 23, in which each of said of said bottom and top confining layers is of $Al_xGa_{1-x}As_1$, with x being from 0.1 to 0.4, and said active layer is GaAs.

25. The method of claim 23, in which said active layer is a multilayer quantum layer comprising at least one $In_yGa_{1-y}As$ well and GaAs barriers with y being within a range of from 0.05 to 0.25.

26. The method of claim 23, in which the active layer includes three $In_{0.2}Ga_{0.8}As$ wells and four GaAs barriers.

27. The method of claim 23, in which the top electrode is in the form of a narrow metal strip on top of the contact layer, said top electrode being coextensive with and in superimposed relation with the mesa and the section of the active layer above the mesa.

28. The method of claim 27, in which said top electrode comprises AuBe.

29. The method of claim 23, in which said overlay electrode comprises TiAu.

30. The method of claim 23, in which said substrate is of GaAs having (100) orientation, and said grooves are etched with [0$\overline{1}$1 orientation.

31. The method of claim 30, in which said grooves were etched with a mixture of $H_2SO_4:H_2O_2:H_2O$ in ratio of 1:1:1.

32. The laser of claim 23, in which each of said confining layers comprises $Al_{0.4}Ga_{0.6}As$.

33. The laser of claim 23, in which each of said confining layer further comprises a thin $Al_{0.15}Ga_{0.85}As$ layer positioned between the active layer and the $Al_{0.4}Ga_{0.6}As$ layer.

* * * * *